(12) United States Patent
Nakagawa

(10) Patent No.: US 6,368,916 B1
(45) Date of Patent: Apr. 9, 2002

(54) METHOD FOR FABRICATING NONVOLATILE SEMICONDUCTOR MEMORY DEVICE

(75) Inventor: Shinichi Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/534,507

(22) Filed: Mar. 24, 2000

(30) Foreign Application Priority Data

Oct. 22, 1999 (JP) .......................................... 11-300401

(51) Int. Cl.[7] .......................................... H10L 21/336
(52) U.S. Cl. ........................ 438/257; 438/297; 257/316
(58) Field of Search ............................... 438/257, 258, 438/266, 301–305, 297, 527, 528; 257/316, 324, 314

(56) References Cited

U.S. PATENT DOCUMENTS 5,514,889 A * 5/1996 Cho et al. ................... 257/316
5,768,192 A   6/1998 Eitan
5,913,122 A * 6/1999 Lee et al. ................... 438/297

* cited by examiner

*Primary Examiner*—David Nelms
*Assistant Examiner*—Dung A Le
(74) *Attorney, Agent, or Firm*—Armstrong, Westerman & Hattori, LLP

(57) ABSTRACT

The method for fabricating a nonvolatile semiconductor memory device comprises the step of forming an insulation film 14 on a semiconductor substrate 10; the step of introducing an impurity into the semiconductor substrate through the insulation film 14 to form a source/drain diffused region 20 and a pocket layer 18; the step of removing the insulation film 14; the step of forming a charge storage layer 28 on the semiconductor substrate 10; and forming gate electrode 40 on the charge storage layer 28 between the source/drain diffused layer 20. Whereby damage due to the ion implantation is not introduced into the charge storage layer. Thus, deterioration of cycling characteristics and data retention characteristics of the nonvolatile semiconductor memory device can be prevented.

15 Claims, 16 Drawing Sheets

METHOD FOR FABRICATING NONVOLATILE SEMICONDUCTOR MEMORY DEVICE

CROSS-REFERENCE TO RELATED APPLICATIONS

This application is based upon and claims priority of Japanese Patent Application No. Hei 11-300401, filed Oct. 22, 1999, the contents being incorporated herein by reference.

BACKGROUND OF THE INVENTION

The present invention relates to a single gate-type nonvolatile semiconductor memory device including a charge storage layer formed of a stacked film of silicon oxide film, silicon nitride film and silicon oxide film, and a method for fabricating the same.

As rewritable nonvolatile semiconductor memory devices, semiconductor memory devices, such as EEPROMs, flash EEPROMs, etc., which store information by storing charges in floating gates, are generally known. Such semiconductor memory devices require floating gates for storing information, in addition to control gates which function as word lines, and accordingly two conductor layers are required to form the memory cell transistors.

On the other hand, as a nonvolatile semiconductor memory device which has a simpler structure and is easy to be highly integrated, a nonvolatile semiconductor memory device including the memory cell transistors having single gates is proposed.

A conventional nonvolatile semiconductor device including the single gates will be explained with reference to FIG. 12. FIG. 12 is a sectional view of the conventional nonvolatile semiconductor memory device.

A plurality of bit lines 114 of an n$^+$ diffused layer are formed on a silicon substrate 100, extended normally to the sheet of the drawing. A bit line oxide film 116 is formed on the bit lines 114. A pocket layer 112 of a p$^-$ diffused layer is formed on both sides of the silicon substrate 100 in the regions between the bit lines 114. Charge storage layer 108 of a stacked film of a silicon oxide film 102, a silicon nitride film 104 and a silicon oxide film 106 is formed on the silicon substrate 100 between the bit lines 114. A plurality of word lines 124 are formed on the bit line oxide film 116 and the charge storage layer 108, extended crossing the bit lines 114. Thus, the single gate-type memory cell transistors having control gates formed of the word lines 124 are formed.

Then, the method for fabricating the conventional nonvolatile semiconductor memory device shown in FIG. 12 will be explained with reference to FIGS. 13A–13D and 14A–14D. FIGS. 13A–13D and 14A–14D are sectional views of the conventional nonvolatile memory device in the steps of the method for fabricating the same, which show the method.

First, an about 200–800 nm-thick device isolation film (not shown) is formed on the silicon substrate 100 by, e.g., the usual LOCOS method to define device regions. The device isolation film is not formed in the memory cell regions.

Next, an about 5–10 nm-thick silicon oxide film 102 is formed on the silicon substrate 100 with the device isolation film formed on by, e.g., thermal oxidation method or CVD method.

Then, an about 2–15 nm-thick silicon nitride film 104 is formed on the silicon oxide film 102 by, e.g., CVD method.

Next, an about 5–10 nm-thick silicon oxide film 106 is formed on the silicon nitride film 104 by, e.g., CVD method.

Thus, the charge storage layer 108 of a stacked structure of the silicon oxide film 102, the silicon nitride film 104 and the silicon oxide film 106 is formed (FIG. 13A).

Then, a photoresist film 110 for exposing regions for the bit lines 114 to be formed in is formed on the charge storage film 108 by the usual lithography. The photoresist film 110 has a stripe pattern extended normally to the drawing sheet.

Then, with the photoresist film 110 as a mask, B$^+$ (boron) ions are implanted to form in the silicon substrate 100 the p$^-$ diffused layer 112 which is to be the pocket layer (FIG. 13B). The B$^+$ ions are implanted, for example, at about 20–40° to a normal to the silicon substrate 100, at acceleration energy of 50–60 keV, and at a dose of $1.0$–$3.0 \times 10^{13}$ cm$^{-2}$.

Next, the silicon oxide film 106 and the silicon nitride film 104 are etched by dry etching with the photoresist film 110 as a mask (FIG. 13C).

Then, As$^+$ (arsenic) ions are implanted with the photoresist film 110 as a mask to form in the silicon substrate 100 the bit lines 114 which function also as the source/drain diffused layer regions (FIG. 13D). As$^+$ ions are implanted, for example, at acceleration energy of 50–60 keV and at a dose of $1.0$–$3.0 \times 10^{15}$ cm$^{-3}$. In the previous step the silicon oxide film 102 is not removed, and remains. This is for the prevention of contamination of the silicon substrate 100 in this ion implanting step.

Next, the photoresist film 110 is removed by the usual ashing.

Then, the silicon substrate 100 is thermally oxidized to form the bit line oxide film 116 of about 50–100 nm-thick on the bit lines 114. The silicon substrate 100 in the regions between the bit lines 114 is not oxidized because of the silicon nitride film 104 which functions as an oxidation mask.

Then, an about 5–10 nm-thick silicon oxide film 118 is formed on the silicon substrate 100 by thermal oxidation (FIG. 14A). The silicon oxide film 118 is a coating film for preventing the silicon nitride film 104 from exposing to thereby deteriorate data retention characteristics.

Next, a conductor film which is to be the word lines is deposited on the entire surface. For example, first an about 100–150 nm-thick polycrystalline silicon film 120 is deposited. Then, P (phosphorus) as an impurity is heavily introduced into the polycrystalline silicon film 120 by, e.g., vapor phase diffusion or ion implantation to make the polycrystalline silicon film 120 less electrical resistance. Then, an about 100–150 nm-thick WSi (tungsten silicide) film 122 is deposited on the polycrystalline silicon film 120 by, e.g., CVD method. Thus, the polycide structure of the stacked film of the WSi film 122 and the polycrystalline silicon film 120 is formed.

Next, the stacked film of the WSi film 122 and the polycrystalline silicon film 120 is patterned by the usual lithography and etching to form the word lines 124 of the stacked film of the WSi film 122 and the polycrystalline silicon film 120. A plurality of the word lines 124 are extended, crossing the bit lines 114.

Then, ion implantation is performed with the bit lien oxide film 116 and the word lines 124 as a mask to form a channel cut layer (not shown) for the isolation of the memory cells. The channel cut layer is formed by implanting B$^+$ ions, for example, at 20–30 keV acceleration energy and at a dose of $1.0$–$3.0 \times 10^{12}$ cm$^{-2}$.

Next, an about 20–30 nm-thick silicon nitride film, an about 100–150 nm-thick silicon oxide film and an about 600–900 nm-thick BPSG film, etc. are sequentially deposited on the entire surface by, e.g., CVD method to form an inter-layer insulation film 126 of the stacked film of these insulation films.

Then, a required interconnection layer, etc. are formed on the inter-layer insulation film 126 by the usual semiconductor fabrication method.

Thus, the nonvolatile semiconductor memory device including the single gates is fabricated.

However, in the above-described conventional nonvolatile semiconductor memory device, as shown in FIG. 15A, the ion implantation for forming the p$^-$ diffused layer 112 is performed after the charge storage layer 108 has been formed, which often damages the charge storage layer 108 near the drain regions and the charge storage layer 108 near the source regions (see FIG. 15B). The charge storage layer 108 especially near the source/drain regions (the actual charge storage layer is the silicon nitride film 104) is a region where electrons are captured to retain information. The damage of the region deteriorates charge retention characteristics, which often leads to deterioration of cycling characteristics and data retention characteristics of the nonvolatile semiconductor memory device.

In the conventional nonvolatile semiconductor memory device, as shown in FIG. 16A, the silicon oxide film 106 and the silicon nitride film 104 are etched with the silicon oxide film 102 as a stopper. The silicon nitride film 102 is so thin that the silicon oxide films 102, 104 are often side-etched due to shortage of a selective ratio between the silicon nitride film and the silicon oxide film, or even the base silicon oxide film 102 is often etched (see FIG. 16B). Etching damage often extends even to the charge storage layer 108 and the inside of the silicon substrate 100, which deteriorates device characteristics.

In fabricating a semiconductor device including nonvolatile semiconductor memory elements and logic elements, it is important to depress addition to a number of fabrication steps and fabricate the semiconductor device without sacrificing high-speed operation of the logic unit.

SUMMARY OF THE INVENTION

An object of the present invention is to provide a method for fabricating a nonvolatile semiconductor memory device which can restrain the damages of the charge storage layer and the base substrate so as to improve cycling characteristics and data retention characteristics of the nonvolatile semiconductor memory device.

Another object of the present invention is to provide a method for fabricating a nonvolatile semiconductor memory device which can be easily rationalized to be together with a logic device fabricating method.

The above-described objects of the present invention are achieved by a method for fabricating a nonvolatile semiconductor memory device comprising the steps of: forming a insulation film on a semiconductor substrate of a first conduction type; introducing an impurity into the semiconductor substrate through the insulation film to form a source diffused layer and a drain diffused layer of a second conduction type which is different from the first conduction type, and a pocket layer of the first conduction type adjacent to the source diffused layer and the drain diffused layer; removing the insulation film; forming a charge storage layer on the semiconductor substrate; and forming a gate electrode on the charge storage layer between the source diffused layer and the drain diffused layer.

In the above-described method for fabricating a nonvolatile semiconductor memory device, it is possible that the insulation film includes at least one silicon nitride film; and the method further comprises, after the step of forming the source diffused layer, the drain diffused layer, and the pocket layer, the step of selectively oxidizing the semiconductor substrate with the silicon nitride film as a mask to form a bit line oxide film.

In the above-described method for fabricating a nonvolatile semiconductor memory device, it is possible that the method further comprises, before the step of forming the source diffused layer, the drain diffused layer, and the pocket layer, the step of selectively oxidizing the semiconductor substrate with the silicon nitride film as a mask to form a device isolation film.

In the above-described method for fabricating a nonvolatile semiconductor memory device, it is possible that the method further comprises, before the step of forming the insulation film, the step of forming a device isolation film, and in which the insulation film is a sacrificial oxidation film which is formed after forming the device isolation film and is removed before forming the charge storage layer.

In the above-described method for fabricating a nonvolatile semiconductor memory device, it is possible that the charge storage layer includes at least one silicon nitride film, and the method further comprises after the step of forming the charge storage layer, the step of selectively oxidizing the semiconductor substrate with the silicon nitride film as a mask to form a bit line oxide film.

In the above-described method for fabricating a nonvolatile semiconductor memory device, it is possible that the charge storage layer includes at least one silicon oxide film, and the silicon oxide film is formed on the semiconductor substrate by thermal oxidation so as to have a large film thickness on the source diffused layer and the drain diffused layer than a film thickness on a rest region.

According to the present invention, the p$^-$ diffused layer forming the pocket layer, and the bit lines are formed without performing the ion-implantation through the charge storage layer, whereby damage due to the ion implantation is not introduced into the charge storage layer as in the conventional nonvolatile semiconductor memory device fabrication method, in which the ion implantation is performed through the charge storage layer. Thus, deterioration of cycling characteristics and data retention characteristics of the nonvolatile semiconductor memory device can be prevented.

Because of the thick oxide film formed below, damage made to the base substrate can be restrained in the step of patterning the charge storage layer. Accordingly, the method for fabricating the nonvolatile semiconductor memory device according to the present invention can restrain deterioration of device characteristics due to the etching damage in comparison with the conventional nonvolatile semiconductor memory device.

The through oxide film for forming the diffused layers of the nonvolatile semiconductor memory device is used also as an oxide film used in forming a logic device, and the pad oxide film and the silicon nitride film as the oxidation mask used in forming the device isolation film are used also in the step of forming the nonvolatile semiconductor memory device, whereby the fabrication steps can be rationalized. Accordingly, in forming a semiconductor device with the nonvolatile semiconductor memory device and a logic device mounted together, the semiconductor device can be fabricated without adding a large number of fabrication steps.

DETAILED DESCRIPTION OF THE INVENTION

A First Embodiment

The method for fabricating the nonvolatile semiconductor memory device according to a first embodiment of the present invention will be explained with reference to FIGS. 1A–1B, 2, 3A–3D, 4A–4C, 5A–5C and 6A–6D.

Figure 1A:
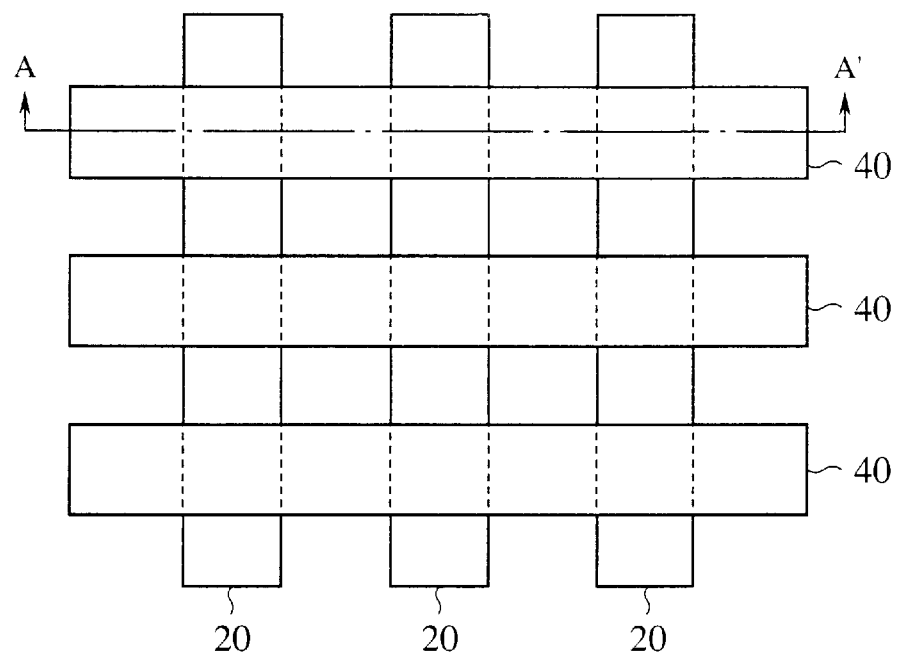
FIG. 1A is a plan view of the nonvolatile semiconductor memory device according to a first and a second embodiments of the present invention.
Figure 1B:
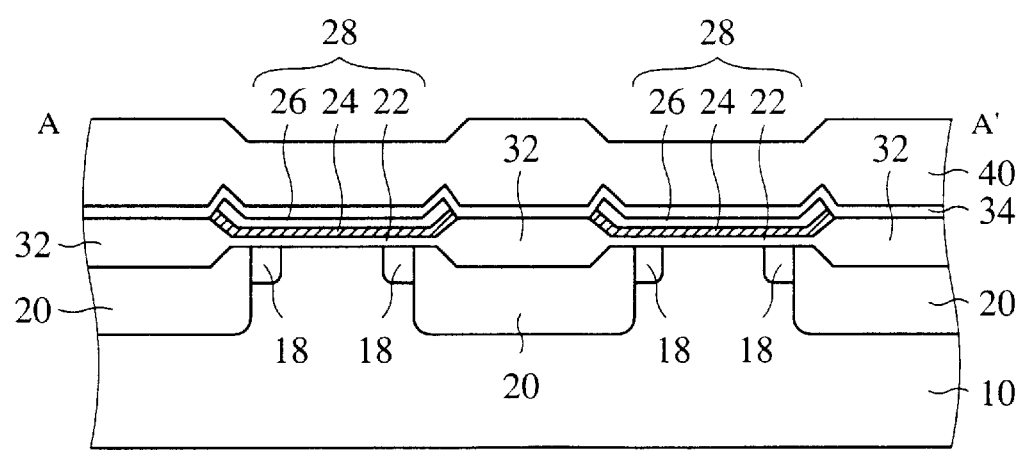
FIG. 1B is a sectional view of the nonvolatile semiconductor memory device according to the first and the second embodiments of the present invention.
Figure 2:
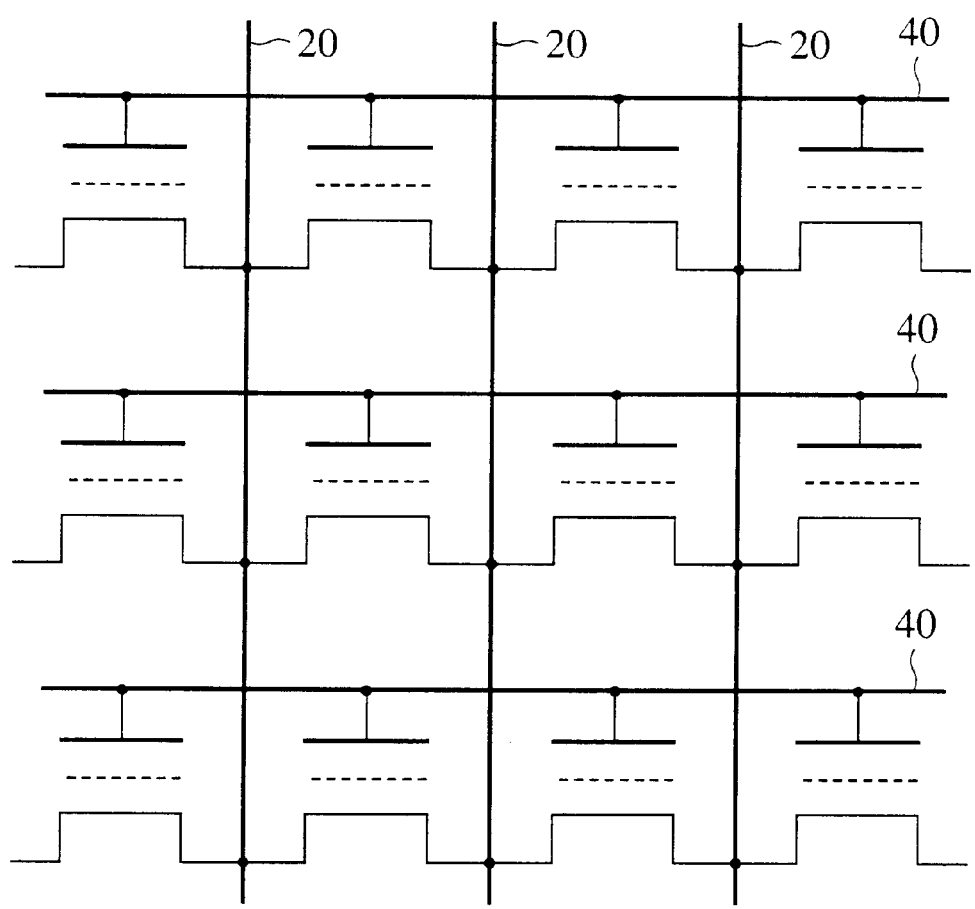
FIG. 2 is a view of an equivalent circuit of the nonvolatile semiconductor memory device according to the first and the second embodiments of the present invention.

FIG. 1A is a sectional view of the nonvolatile semiconductor memory device according to the present embodiment, which show a structure thereof. FIG. 1B is a plan view of the nonvolatile semiconductor memory device according to the present embodiment, which show a structure thereof. FIG. 2 is a view of an equivalent circuit of the nonvolatile semiconductor memory device according to the present embodiment. FIGS. 3A–3D, 4A–4C, 5A–5C and 6A–6D are sectional views of the nonvolatile semiconductor memory device according to the present embodiment in the steps of the method for fabricating the nonvolatile semiconductor memory device, which explain the method.

First, the structure of the nonvolatile semiconductor memory device according to the present embodiment will be explained with reference to FIGS. 1A–1B and 2. FIG. 1A is a plan view of the nonvolatile semiconductor memory device according to the present embodiment. FIG. 1B is a sectional view along the line A–A' in FIG. 1A.

A plurality of bit lines 20 which are formed of an n+ diffused layer extended normally to the drawing sheet and function as source/drain diffused layers of memory cell transistors are formed on a silicon substrate 10. A bit line oxide film 32 for isolating the bit lines 20 and word lines 40 from each other is formed on the bit lines 20. A p− diffused layer 18 forming a pocket layer is formed on both sides of the silicon substrate 10 in the regions between the bit lines 20 and their adjacent ones. An insulative charge storage layer 28 formed of a stacked film of a silicon oxide film 22, a silicon nitride film 24, and a silicon oxide film 26 is formed on the silicon substrate 10 in the regions between the bit lines 20 and their adjacent ones. A silicon oxide film 34 and a plurality of word lines extended, crossing the bit lines 20 are formed on the bit line oxide film 32 and the charge storage layer 28. Thus, memory cell transistors including the single gate are fabricated.

An equivalent circuit of the nonvolatile semiconductor memory device shown in FIG. 1 is as shown in FIG. 2. A plurality of the word lines 40 are extended transversely to the drawing sheet, and form an interconnection layer which functions as the gate electrodes (control gates) of a plurality of memory cell transistors extended in the same direction as the word lines 40. A plurality of the bit lines 20 are extended normally to the drawing sheet and are connected to the source/drain diffused layers of the memory cell transistors. The source diffused layer and the drain diffused layer of each memory cell transistor are connected to the bit lines 20 different from each other. Those of the memory cell transistors, which are adjacent to each other are connected commonly to the bit line 20.

In the nonvolatile semiconductor memory device having the single gates as shown in FIG. 1, information writing is performed by injecting hot electrons flowing between the bit lines 20, into the charge storage layer 28 via the p− diffused layer 18, which is the pocket layer. The injected electrons are stored in the charge storage layer 28 near the interface between the bit line oxide film 32 and the silicon substrate 10 and, in the normal state, are retained as they are. Thus, the device is enabled to function as a nonvolatile memory device using the stored electrons as stored information. On the other hand, erasing the information is performed by injecting hot holes flowing between the bit lines 20, into the charge storage layer 28 via the p− diffused layer 18 to compensate the electrons. Reading the stored information is performed by detecting currents flowing between the bit lines 20 when a voltage is applied to the word lines 40.

Next, the method for fabricating the nonvolatile semiconductor memory device according to the present embodiment will be explained with reference to FIGS. 3A–3D, 4A–4C, 5A–5C and 6A–6D. FIGS. 3A–3D, 4A–4C and 5A–5C are sectional views of the nonvolatile semiconductor memory device along memory cell regions in the steps of the method. FIGS. 6A–6D are sectional views of the nonvolatile semiconductor memory device along a peripheral circuit region.

An about 200–800 nm-thick device isolation film 12 is formed on a p-type silicon substrate 10 by, e.g., the usual LOCOS method to define device regions. The device isolation film 12 is not formed in the memory cell regions.

Figure 3A:
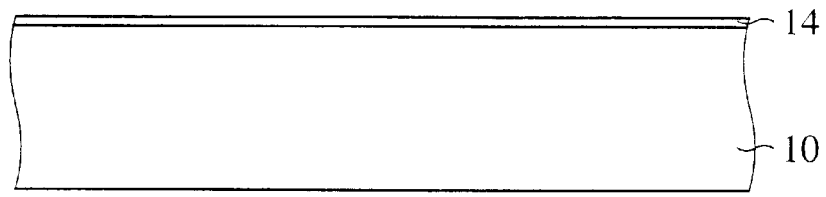
FIGS. 3A–3D, 4A–4C, 5A–5C and 6A–6D are sectional views of the nonvolatile semiconductor memory device according to the first embodiment in the steps of the method for fabricating the same, which explain the method.
Figure 6A:
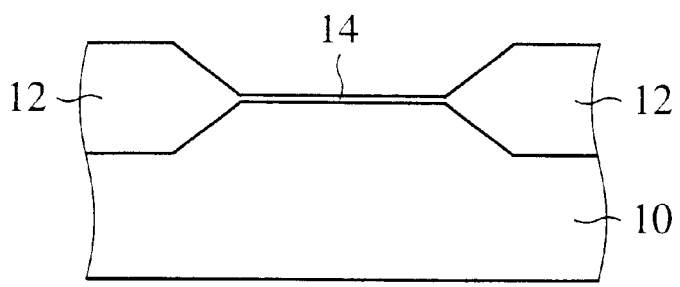

Then, a silicon nitride film (not shown) as an oxidation mask and a pad oxide film (not shown) for the stress mitigation used in forming the device isolation film 12 by the LOCOS method are removed, and next the silicon substrate 10 is thermally oxidized to form a sacrificial oxidation film 14 of an about 5–10 nm-thick silicon oxide film (FIGS. 3A and 6A). The sacrificial oxidation film 14 is a film for removing so-called white ribbons formed in the step of forming the device isolation film 12.

Figure 6B:
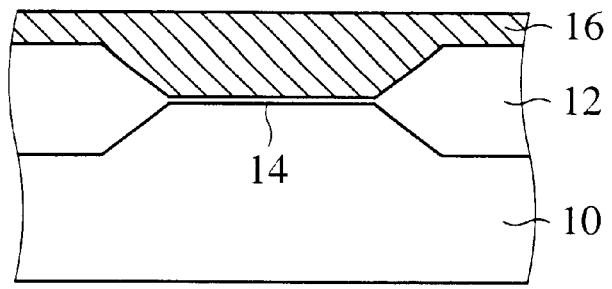
Figure 6C:
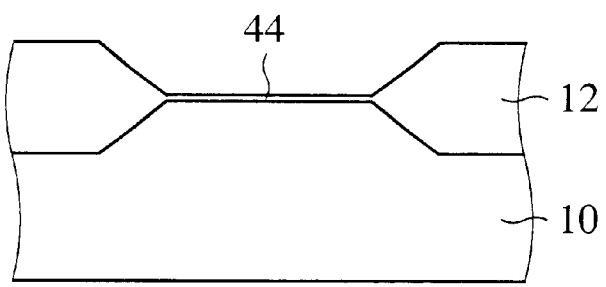

Then, a photoresist film 16 for exposing regions for the bit lines 20 to be formed in is formed on the sacrificial oxidation film 14 by the usual lithography. The photoresist film 16 has a stripe patter extended normally to the drawing sheet. At this time, peripheral circuit regions are covered with the photoresist film 16 (FIG. 6B).

Figure 3B:
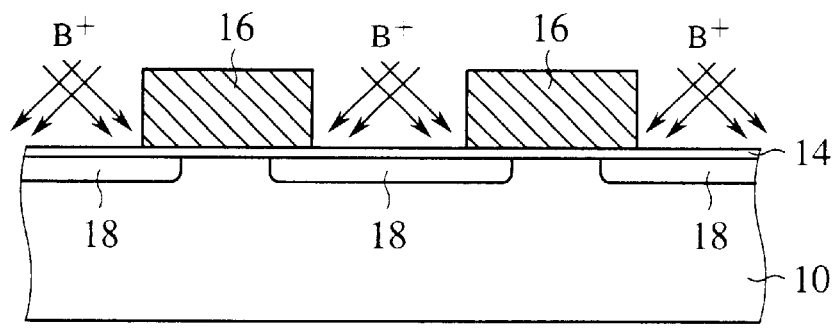

Next, B$^+$ (boron) ions are implanted into the silicon substrate 10 with the photoresist film 16 as a mask to form the p$^-$ diffused layer 18, which is to be the pocket layer. The p$^-$ diffused layer 18 is formed by implanting B$^+$ ions slantly at about 20–40° to the normal with respect to the silicon substrate 10 at, for example, 50–60 keV acceleration energy and a 1.0–3.0×10$^{13}$ cm$^{-2}$ dose (FIG. 3B). The ion implantation is performed slantly because the pocket layer 18, which intensifies an electric field in the source/drain diffused layer regions to thereby improve hot carrier generation efficiency and function as a punch-through stopper, should be formed, extended more toward the channels than the source/drain diffused layer regions.

In the method for fabricating the nonvolatile semiconductor memory device according to the present embodiment, the p$^-$ diffused layer 18 is formed by the ion implantation which is performed not through the charge storage layer but through the sacrificial oxidation film 14. Accordingly, ion implantation damage is not introduced into the charge storage layer in the step of forming the p$^-$ diffused layer 18, as is in the method for fabricating the conventional nonvolatile semiconductor memory device in which the ion implantation is performed through the charge storage layer.

Figure 3C:
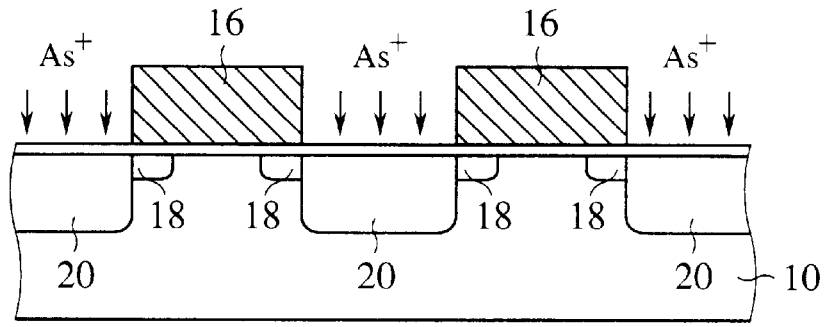

Then, As$^+$ (arsenic) ions are implanted with the photoresist film 16 as a mask to form in the silicon substrate 10 the bit lines 20 which are also the source/drain diffused layer regions (FIG. 3C). As$^+$ ions are implanted, for example, at 50–60 keV acceleration energy and a 1.0–3.0×10$^5$ cm$^{-2}$ dose to form the bit lines 20 of an n$^+$ diffused layer.

The p$^-$ diffused layer 18 and the bit lines 20 are thus formed, whereby an acceptor impurity is compensated in the regions for the bit lines 20 formed in, and the p$^-$ diffused layer 18 is left only on both sides of the silicon substrate 10 in the regions between the bit lines 20. Thus, the pocket structure is formed.

Figure 3D:
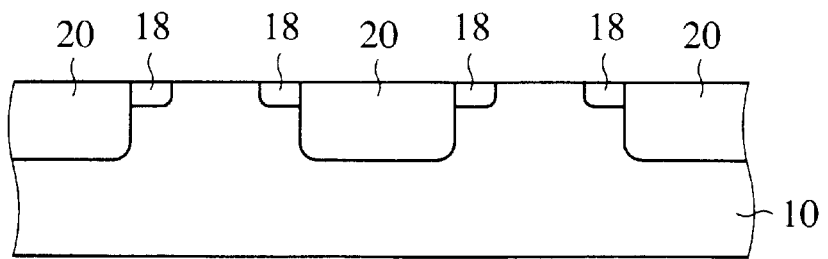

Then, the photoresist film 16 is removed by the usual resist ashing, and the sacrificial oxidation film 14 is removed by wet etching using a hydrofluoric acid-based aqueous solution (FIG. 3D).

Figure 4A:
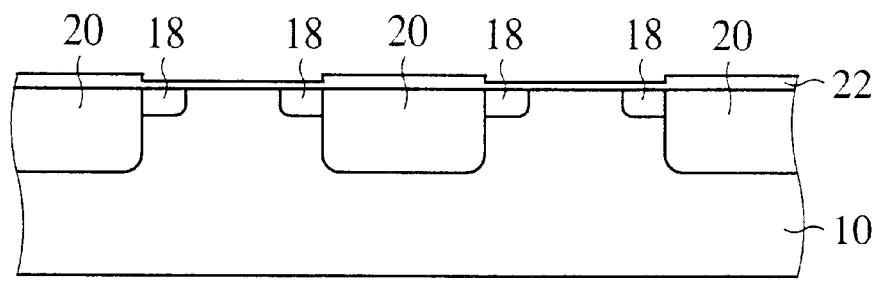

Next, an about 5–10 nm-thick silicon oxide film 22 is formed on the silicon substrate 10 by, e.g., thermal oxidation. At this time, in the regions for the bit lines 20 formed in, which have been damaged by the high-dose ion implantation, the silicon oxide film 22 is formed due to enhanced oxidation in a film thickness which is slightly less than twice a film thickness of the silicon oxide film 22 formed in the region where the bit lines 20 have not been formed (FIG. 4A).

Then, an about 2–15 nm-thick silicon nitride film 24 is formed on the silicon oxide film 22 by, e.g., CVD method.

Then, an about 5–10 nm-thick silicon oxide film 26 is formed on the silicon nitride film 24 by, e.g., thermal oxidation.

Figure 4B:
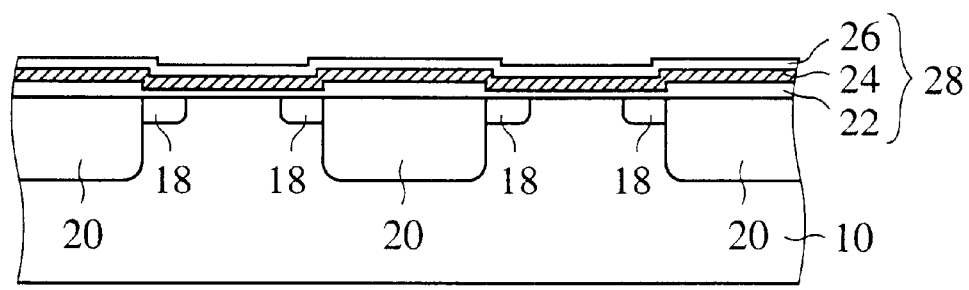

Thus, the charge storage layer 28 of the stacked structure of the silicon oxide film 22, the silicon nitride film 24 and the silicon oxide film 26 is formed (FIG. 4B). In the present embodiment, the stacked structure of the silicon oxide film 22, the silicon nitride film 24 and the silicon oxide film 26 is called the charge storage layer 28, but charges are actually stored in the silicon nitride film 24.

Next, a photoresist film 30 for covering the device regions between the bit lines 20 is formed on the charge storage layer 28 by the usual lithography.

Figure 4C:
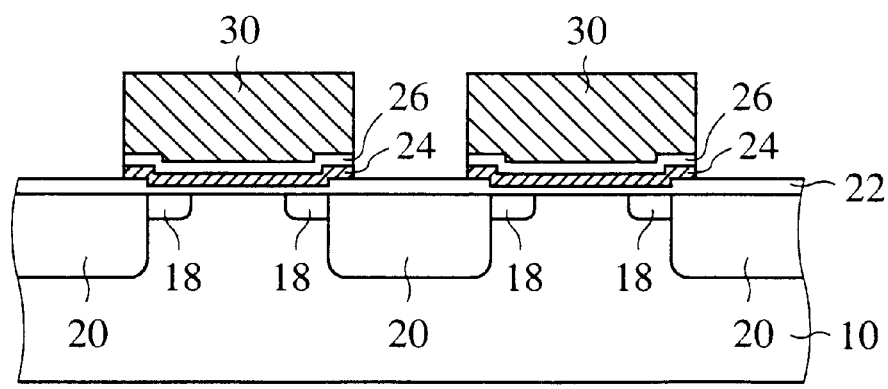

Then, the silicon oxide film 26 and the silicon nitride film 24 are dry-etched with the photoresist film 30 as a mask (FIG. 4C).

At this time, the photoresist 30 is patterned so that the ends of the patterns are positioned on the parts of the silicon oxide film 26 having an increased film thickness due to the enhanced oxidation, whereby the silicon oxide film 22 is prevented from being totally removed by over-etching when the silicon oxide film 26 and the silicon nitride film 24 are etched. Accordingly, the method for fabricating the nonvolatile semiconductor memory device according to the present embodiment can restrain deterioration of device characteristics due to damages by the etching in comparison with the conventional nonvolatile semiconductor memory device.

Next, the photoresist film 30 is removed, and then the silicon substrate 10 is thermally oxidized to form the bit line oxide film 32 of about 50–100 nm-thick is formed on the bit lines 20. The base silicon substrate 10 in the regions between the bit lines 20, and the peripheral circuit regions is not oxidized because of the silicon nitride film 24, which functions as oxidation mask.

Figure 5A:
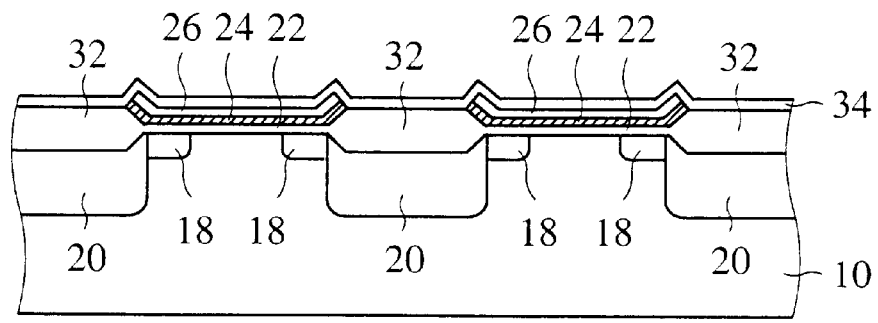

Then, the silicon oxide film 34 of about 5–10 nm-thick is formed by thermal oxidation (FIG. 5A). The silicon oxide film 34 is a film for preventing the word lines, which will be formed in a later step from directly contacting the silicon nitride film 24 to deteriorate data retention characteristics. The silicon oxide film 34 can be formed concurrently with the gate insulation film 44 in the oxidation step of forming the gate insulation film 44 of the peripheral circuit transistors.

Next, a conductor film which is to be the word lines is deposited on the entire surface. For example, an about 100–150 nm-thick polycrystalline silicon film 36 is deposited on the entire surface. Next, P (phosphorus) as an impurity is heavily introduced into the polycrystalline silicon film 36 by, e.g., gas-phase diffusion or ion implantation to make the film less electric resistance. Then, an about 100–150 nm-thick WSi (tungsten silicide) film 38 is deposited by, e.g., CVD method. Thus, a stacked film of the polycide structure of the polycrystalline silicon film 36 and the WSi film 38 is formed.

Figure 5B:
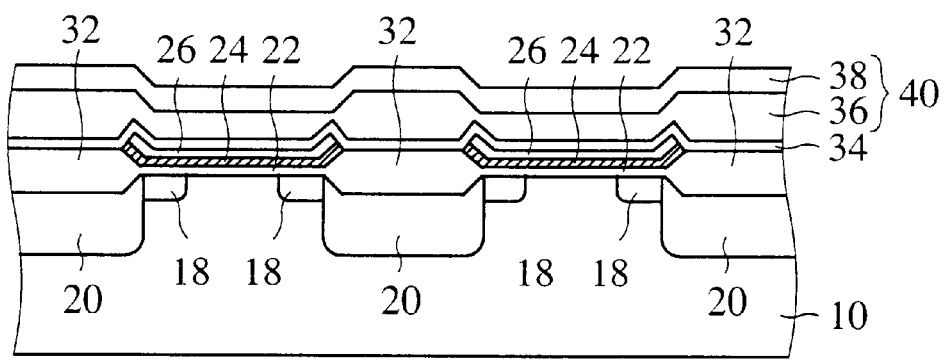
Figure 5C:
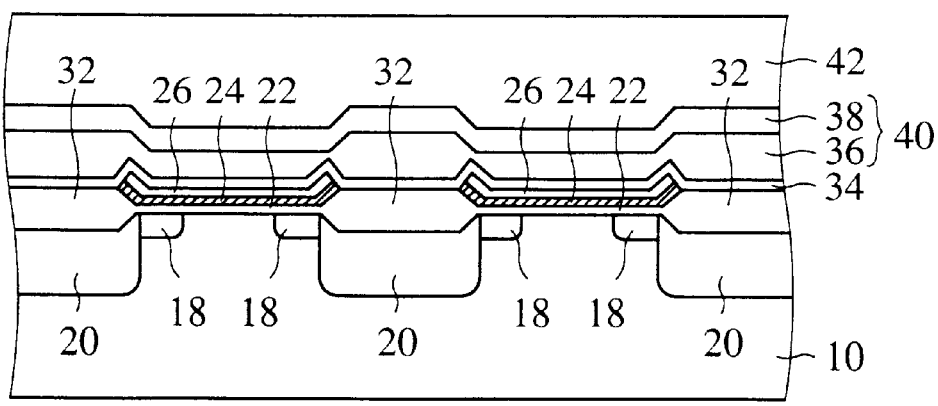
Figure 6D:
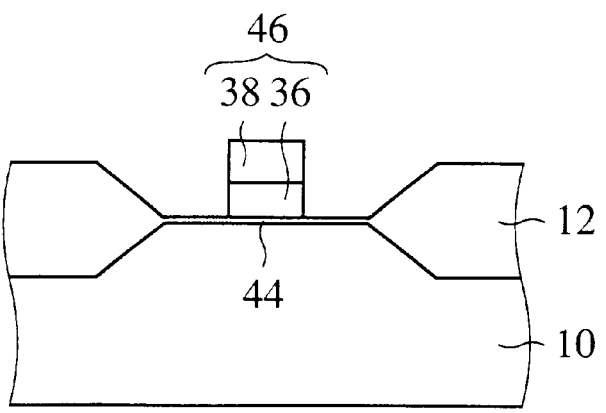

Then, the stacked film of the polycrystalline silicon film 36 and the WSi film 38 is patterned by the usual lithography and etching to form the word lines of the polycrystalline silicon film 36 and the WSi film 38, and the gate electrodes 46 of the peripheral circuit transistors (FIG. 5B and FIG. 6D). The word lines 40 are extended in a plural number, crossing the bit lines 20.

Next, ion implantation is performed with the bit line oxidation film 32 and the word lines 40 as a mask to form a channel cut layer (not shown) for isolating memory cell regions. For example, B$^+$ ions are implanted at 20–30 keV acceleration energy and a 1.0–3.0×10$^{12}$ cm$^{-2}$ dose to form the channel cut layer.

Then, an about 20–30 nm-thick silicon nitride film, an about 100–150 nm-thick silicon oxide film and an about 600–900 nm-thick BPSG film, etc. are sequentially deposited on the entire surface by, e.g., CVD method to form an inter-layer insulation film 42 of the stacked film of these insulation films.

Then, a required interconnection layer, etc. (not shown) are formed on the inter-layer insulation film 122 in the same way as in the usual semiconductor device fabrication method.

As described above, according to the present embodiment, the ion implantation is performed not through the charge storage layer but through the sacrificial oxidation film to form the p⁻ diffused layer, whereby the ion implantation damage is not introduced into the charge storage layer in the step of forming the p⁻ diffused layer as is in the conventional nonvolatile semiconductor memory device fabrication method in which the ion implantation is performed through the charge storage layer. Accordingly, the nonvolatile semiconductor memory device can have improved cycling characteristics and data retention characteristics.

The bottom oxide film of the charge storage layer can be formed thicker selectively on the parts thereof on the bit lines, whereby damage to the base substrate can be restrained in the step of patterning the charge storage layer. Accordingly, in comparison with the conventional nonvolatile semiconductor memory device fabrication method, the nonvolatile semiconductor memory device according to the present embodiment can restrain deterioration of device characteristics due to the etching damage.

In the present embodiment, the p⁻ diffused layer 18 and the bit lines are formed through the sacrificial oxidation film 14 but may be formed through another film formed on silicon substrate 10. For example, the pad oxide film, and the silicon nitride film as the oxidation mask used in the step of forming the device isolation film 12 are left to perform the ion implantation therethrough.

A Second Embodiment

The method for fabricating the nonvolatile semiconductor memory device according to a second embodiment will be explained with reference to FIGS. 7A–7D, 8A–8D, 9A–9C and 10A–10D. The same members of the present embodiment as those of the nonvolatile semiconductor memory device according to the first embodiment are represented by the same reference numbers not to repeat or to simplify their explanation.

FIGS. 7A–7D, 8A–8D, 9A–9C and 10A–10D are sectional views of the nonvolatile semiconductor memory device according to the present embodiment in the steps of the method for the same, which explain the method. FIGS. 7A–7D, 8A–8D and 9A–9C are sectional views of the nonvolatile semiconductor memory device according to the present embodiment along memory cell regions in the steps of the method for fabricating the same. FIGS. 10A–10D are sectional views of the nonvolatile semiconductor memory device according to the present embodiment along a peripheral circuit region.

First, an about 200–800 nm-thick device isolation film 12 is formed on a p-type silicon substrate 10 by, e.g., the usual LOCOS to define device regions.

Next, the silicon nitride film and the pad oxide film which have been used in forming the device isolation film 12 by LOCOS have been removed, and then a sacrificial oxidation film 14 of an about 5–10 nm-thick silicon oxide film is formed by thermal oxidation.

Figure 7A:
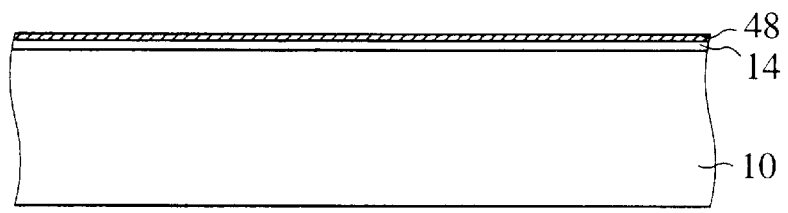
FIGS. 7A–7D, 8A–8D, 9A–9C and 10A–10D are sectional views of the nonvolatile semiconductor memory device according to the second embodiment in the steps of the method for fabricating the same, which explain the method.
Figure 10A:
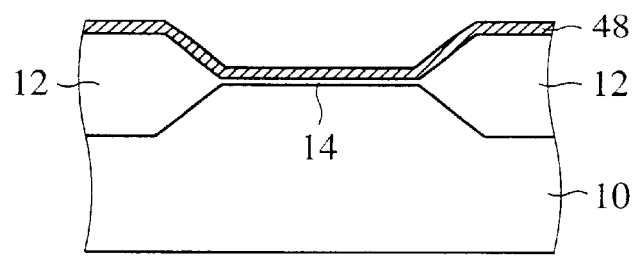

Next, an about 2–15 nm-thick silicon nitride film 48 is formed on the entire surface by, e.g., CVD method (FIG. 7A and FIG. 10A).

Figure 10B:
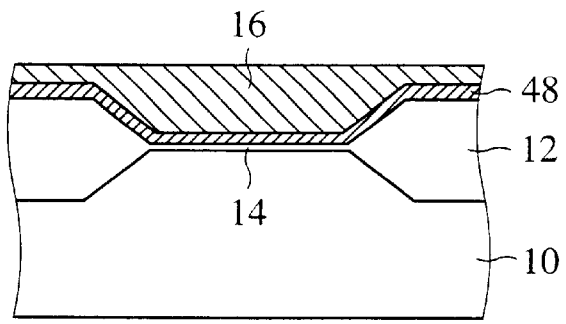

Then, a photoresist film 16 for exposing regions for bit lines to be formed in is formed on the sacrificial oxidation film 14 by the usual lithography. At this time, the peripheral circuit regions are covered with the photoresist film 16 (FIG. 10B).

Figure 7B:
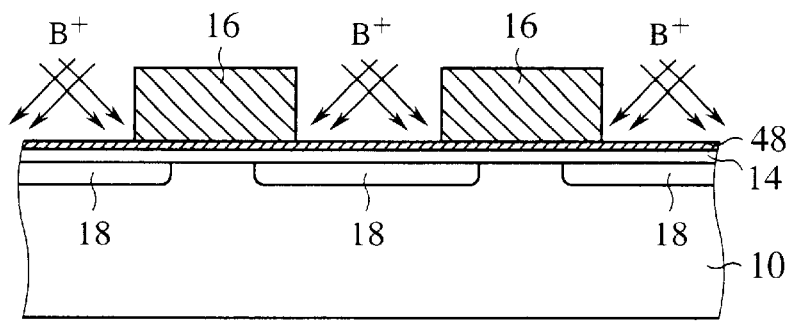

Next, with the photoresist film 16 as a mask, B⁺ ions are implanted to form in the silicon substrate 10 a p⁻ diffused layer 18 which is to be a pocket layer (FIG. 7B). B⁺ ions are implanted, for example, slantly at about 20–40° to the normal with respect to the silicon substrate 10 at, for example, 50–60 keV acceleration energy and a 1.014 3.0× 10¹³ cm⁻² dose to form the p⁻ diffused layer 18.

In the method for fabricating the nonvolatile semiconductor memory device according to the present embodiment, the ion implantation is performed not through the charge storage layer but through the sacrificial oxidation film 14 and the silicon nitride film 48 to form the p⁻ diffused layer 18. Accordingly, damage due to the ion implantation is not introduced in the charge storage layer in the step of forming the p⁻ diffused layer 18.

Figure 7C:
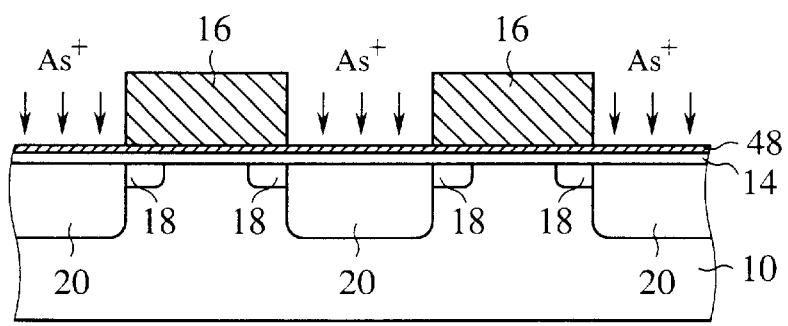

Then, As⁺ ions are implanted into the silicon substrate 10 with the photoresist film 16 as a mask to form bit lines 20 which are also source/drain diffused regions (FIG. 7C). The ion implantation is performed, for example, at 50–60 keV acceleration energy and a 1.0–3.0×10¹⁵ cm⁻² dose to form the bit lines 20 of the n⁺ diffused layer.

Figure 7D:
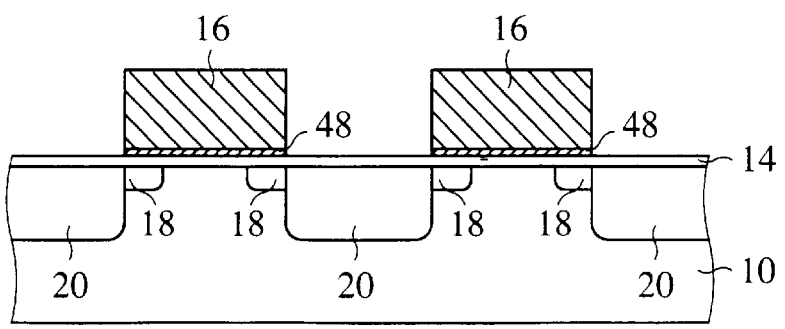

Next, the silicon nitride film 48 is etched with the photoresist film 16 as a mask (FIG. 7D).

Figure 8A:
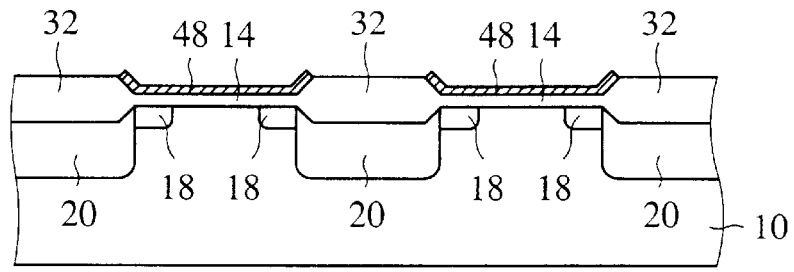

Then, the photoresist film 16 is removed by the usual resist ashing, and then the silicon substrate 10 is thermally oxidized with the silicon nitride film 48 as an oxidation mask to form a bit line oxide film 32 on the bit lines 20 (FIG. 8A).

Figure 8B:
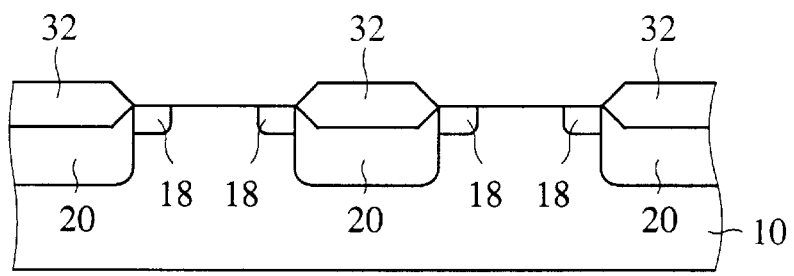

Next, the silicon nitride film 48 is removed with, e.g., boiled phosphoric acid, and the sacrificial oxidation film 14 is removed by wet etching using, e.g., hydrofluoric acid-based aqueous solution (FIG. 8B).

Then, the silicon substrate 10 is thermally oxidized to form an about 5–10 nm-thick silicon oxide film 22.

Next, an about 2–15 nm-thick silicon nitride film 24 is formed on the silicon oxide film 22 by, e.g., CVD method.

Then, an about 5–10 nm-thick silicon oxide film 26 is formed on the silicon nitride film 24 by, e.g., thermal oxidation.

Figure 8C:
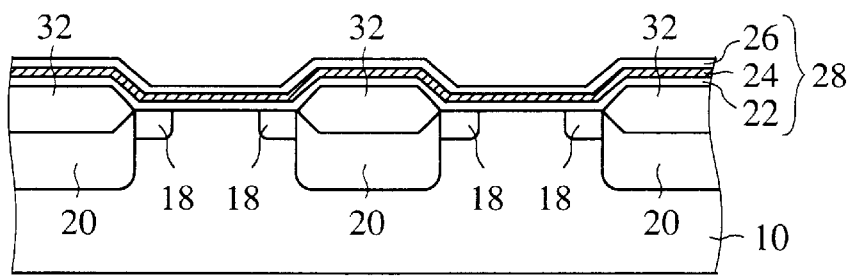

Thus, the charge storage layer 28 of the layer structure of the silicon oxide film 22, the silicon nitride film 24 and the silicon oxide film 26 is formed (FIG. 8C).

Then, a photoresist film 30 for exposing device regions between the bit lines 20 are formed on the charge storage layer 28 by the usual lithography.

Figure 8D:
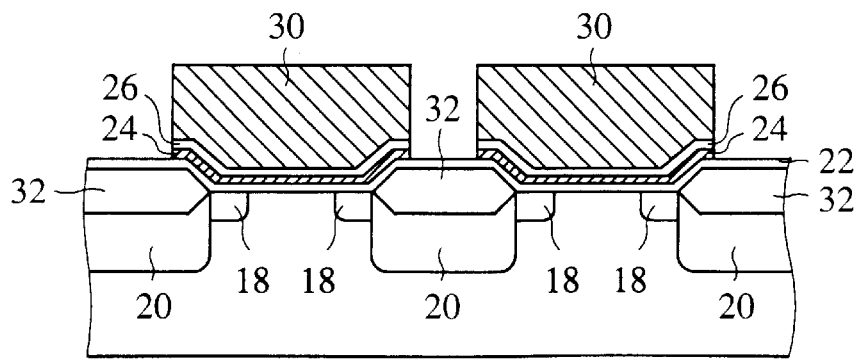

Next, the silicon oxide film 26 and the silicon nitride film 24 are etched by dry etching with the photoresist film 30 as a mask (FIG. 8D).

At this time, the photoresist film 30 is patterned so that the ends of respective patterns thereof are positioned on the bit line oxide film 32, whereby the silicon oxide film 22 are prevented from being totally etched by over-etching when the silicon oxide film 26 and the silicon nitride film 24 are etched. The method for fabricating the nonvolatile semiconductor memory device according to the present embodiment can restrain deterioration of device characteristics due to damages of the etching in comparison with the conventional nonvolatile semiconductor memory device fabrication method.

Figure 9A:
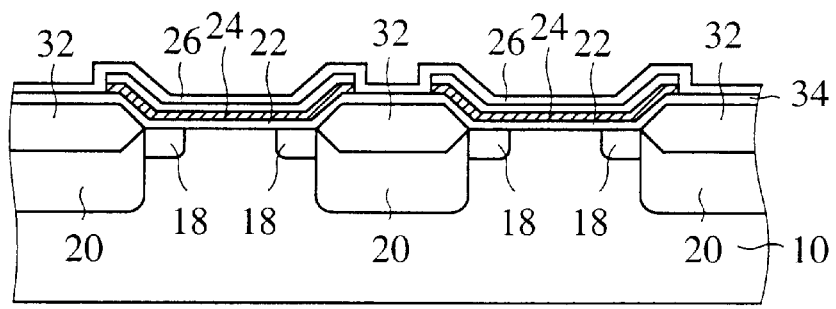
Figure 10C:
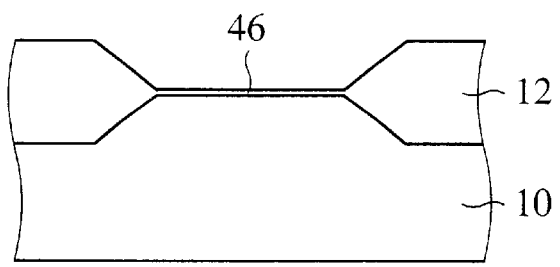

Next, the photoresist film 30 is removed, and then an about 5–10 nm-thick silicon oxide film 34 is formed by thermal oxidation. In the same way as in the method for fabricating the nonvolatile semiconductor memory device according to the first embodiment, the silicon oxide film 34 can be formed concurrently with the oxidation step for forming gate electrodes 44 of the peripheral circuit transistors (FIG. 9A and FIG. 10C).

Then, a conductor film which is to be the word lines is deposited on the entire surface. For example, first an about 100–150 nm-thick polycrystalline silicon film 36 is deposited by CVD method. Then, P (phosphorus) as an impurity is heavily introduced into the polycrystalline silicon film 36 by, e.g., gas-phase diffusion or ion implantation to make the polycrystalline silicon film less electric resistance. Next, an about 100–150 nm-thick WSi (tungsten silicide) film 38 is deposited on the polycrystalline silicon film 36 by, e.g., CVD method. Thus, the stacked film of the polycide structure of the polycrystalline silicon film 36 and the WSi film 38 is formed.

Figure 9B:
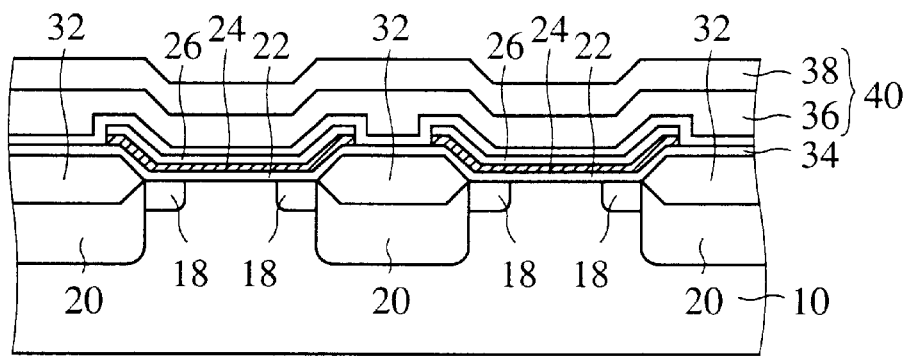
Figure 10D:
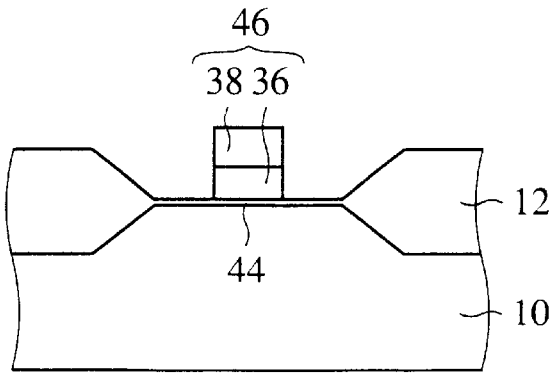

Next, the stacked film of the polycrystalline silicon film 36 and the WSi film 38 is patterned by the usual lithography and the etching to form the word lines 40 and the gate electrodes 46 of the peripheral circuit transistors of the stacked film of the polycrystalline silicon film 36 and the WSi film 38 (FIG. 9B and FIG. 10D).

Then, with the bit line oxide film 32 and the word lines 40 as a mask ion implantation is performed to form a channel cut layer (not shown) for isolating memory cell regions. For example, $B^+$ ions are implanted at 20–30 keV acceleration energy and a $1.0–3.0 \times 10^{12}$ cm$^{-2}$ dose to form the channel cut layer.

Next, an about 20–30 nm-thick silicon nitride film, an about 100–150 nm-thick silicon oxide film, an about 600–900 nm-thick BPSG film, etc. are sequentially deposited on the entire surface by, e.g., CVD method to form an inter-layer insulation film 42 of a stacked film of these insulation films.

Figure 9C:
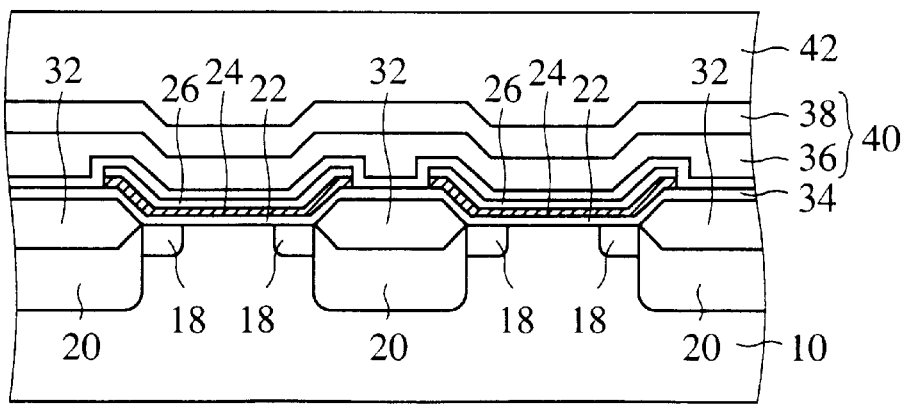

Then, a required interconnection layer, etc (not shown) are formed on the inter-layer insulation film 122 in the same way as in the usual semiconductor fabrication method (FIG. 9C).

As described above, according to the present embodiment, the ion implantation is performed not through the charge storage layer but through the sacrificial oxidation film and the silicon nitride film to form the p$^-$ diffused layer, whereby damage due to the ion implantation is not introduced into the charge storage layer in the step of forming the p$^-$ diffused layer as is in the conventional nonvolatile semiconductor memory device fabrication method, in which the ion implantation is performed through the charge storage layer. Thus, deterioration of cycling characteristics and data retention characteristics of the nonvolatile semiconductor memory device can be prevented.

The bit line oxide film is formed before patterning the charge storage layer, whereby damage made to the base substrate in the step of patterning the charge storage layer can be restrained. Accordingly, the method for fabricating the nonvolatile semiconductor memory device according to the present embodiment can restrain deterioration of device characteristics due to the etching damage in comparison with the conventional nonvolatile semiconductor memory device.

The through oxide film for forming the diffused layers of the nonvolatile semiconductor device is used also as an oxide film used in forming a logic device, and the pad oxide film used in forming the device isolation film and the silicon nitride film as the oxidation mask are used also in the step of forming the nonvolatile semiconductor memory device, whereby the fabrication steps can be rationalized. Accordingly, in forming a semiconductor device with the nonvolatile semiconductor memory device and a logic device mounted together, the semiconductor device can be fabricated without adding a large number of fabrication steps.

In the present embodiment, a through film used in forming the p$^-$ diffused layer 18 and the bit lines 20 is provided by the sacrificial oxidation film 14 and the silicon nitride film 48, but may be provided by a pad oxide film, and a silicon nitride film as an oxidation mask used in forming the device isolation film.

First, the pad oxide film 50, and the silicon nitride film 52 as an oxidation mask are formed on the silicon substrate 10.

Figure 11A:
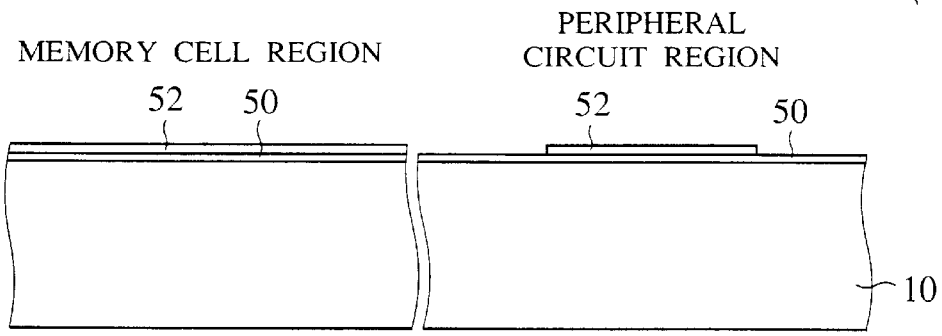
FIGS. 11A–11D are sectional views of the nonvolatile semiconductor memory device according to a modification of the second embodiment in the steps of the method for fabricating the same, which explain the method.

Next, the silicon nitride film 52 is patterned so as to expose the regions for the device isolation film 12 to be formed in, by the usual lithography and etching (FIG. 11A).

Figure 11B:
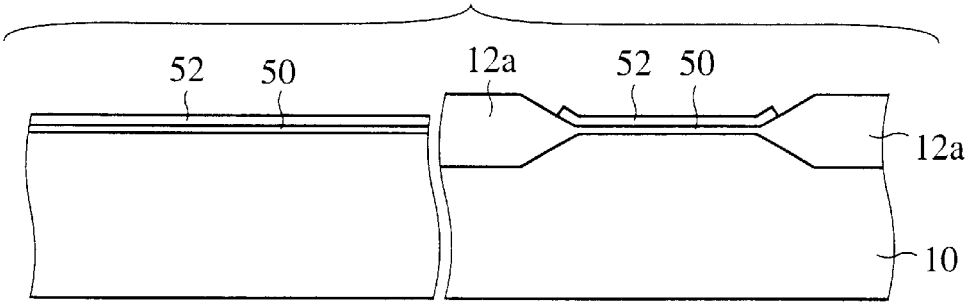

Then, with the silicon nitride film 52 as an oxidation mask, the silicon substrate 10 is thermally oxidized to form the device isolation film 12a which is thinner by a prescribed film thickness amount than a required film thickness (FIG. 11B).

Figure 11C:
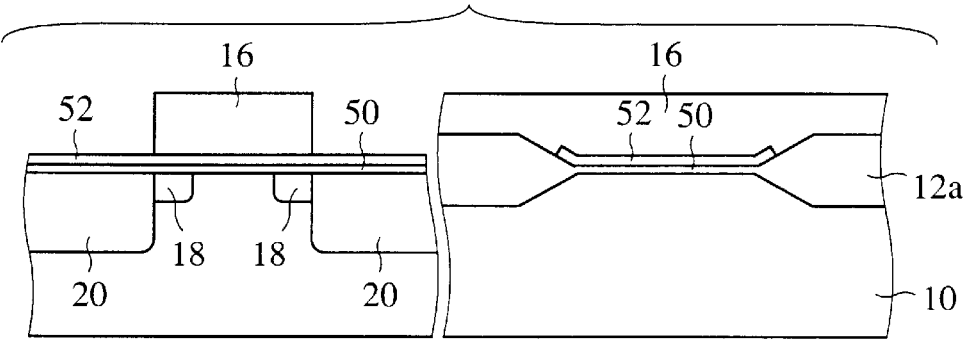

Next, in the same way as show in FIGS. 7B and 7C, the p$^-$ diffused layer 18 and the bit lines 20 are formed. At this time, a through film for the ion implantation is the pad oxide film 50 and the silicon nitride film 52 (FIG. 11c).

Next, in the same way as shown in FIG. 7C, the silicon nitride film 52 is removed with the photoresist film 16 as a mask.

Figure 11D:
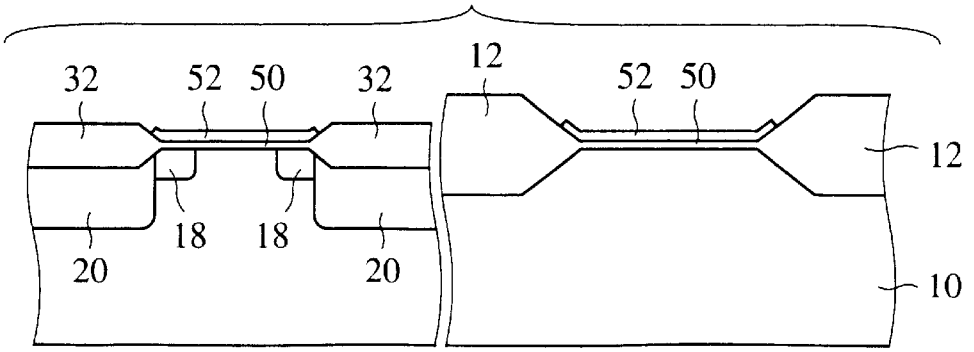
Figure 12:
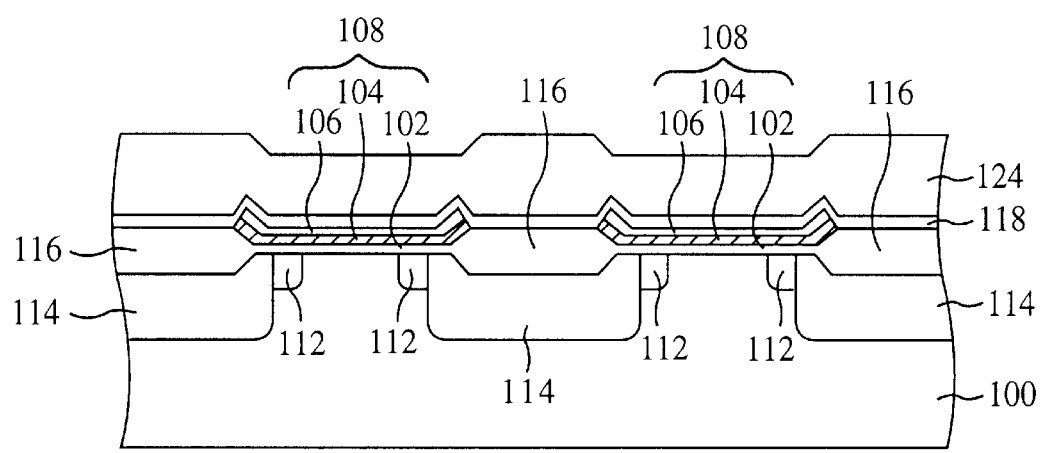
FIG. 12 is a sectional view of the conventional nonvolatile semiconductor memory device, which shows the structure thereof.
Figure 13A:
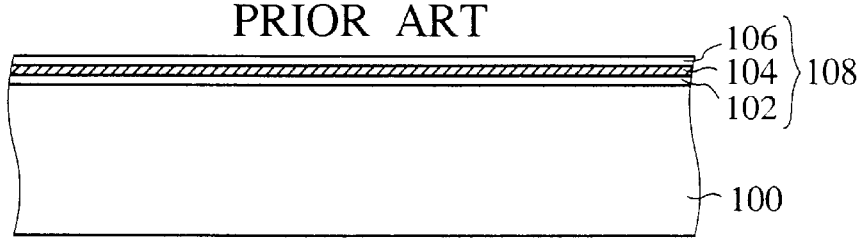
FIGS. 13A–13D and 14A–14D are sectional views of the conventional nonvolatile semiconductor memory device in the steps of the method for fabricating the same, which explain the method.
Figure 13B:
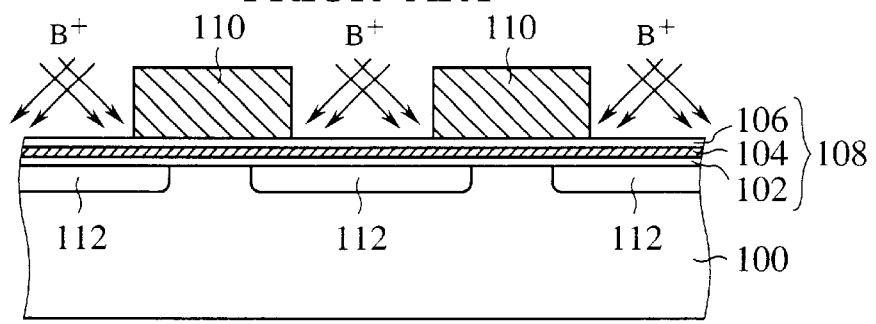
Figure 13C:
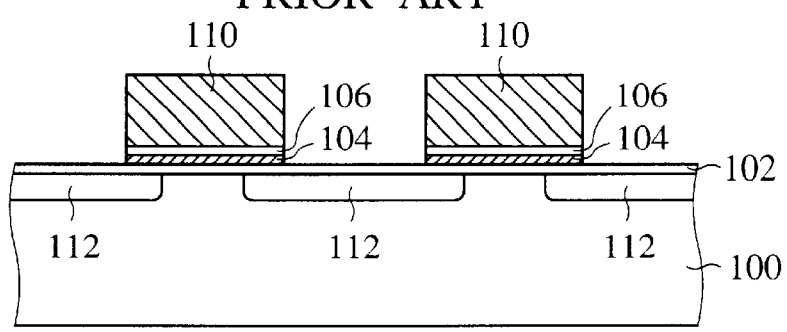
Figure 13D:
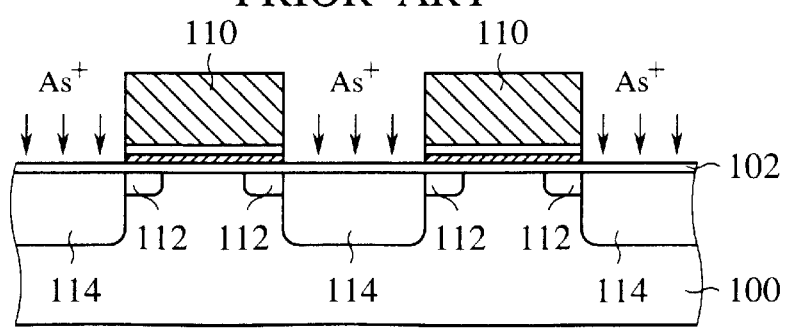
Figure 14A:
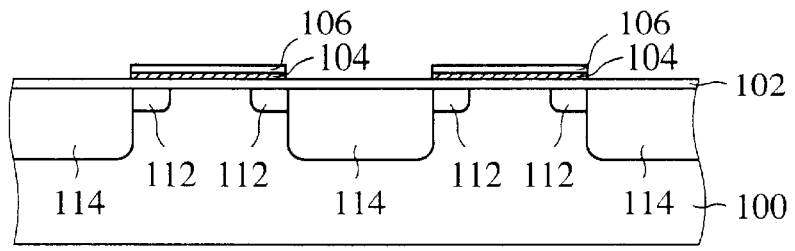
Figure 14B:
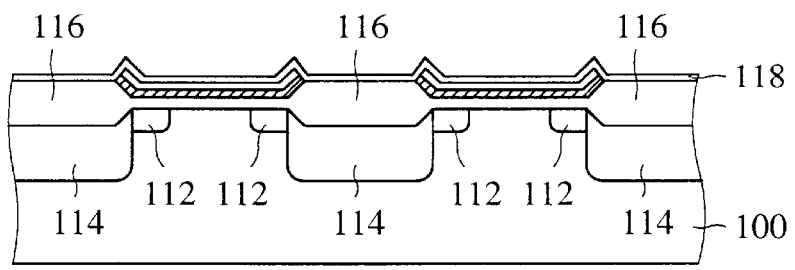
Figure 14C:
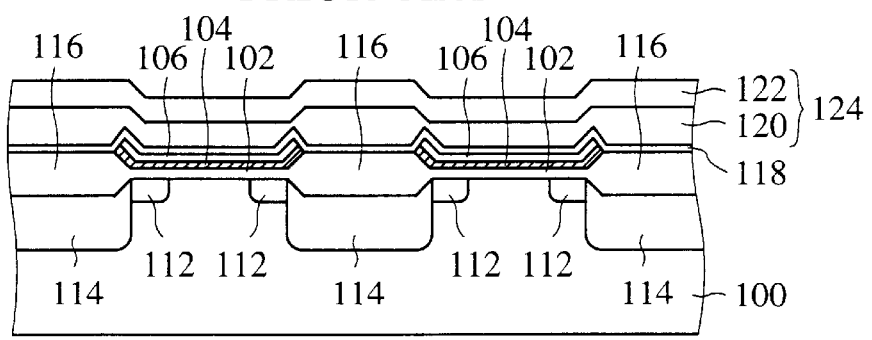
Figure 14D:
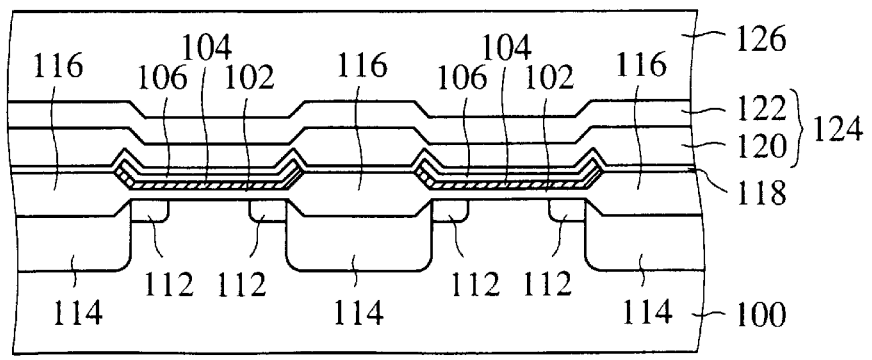
Figure 15A:
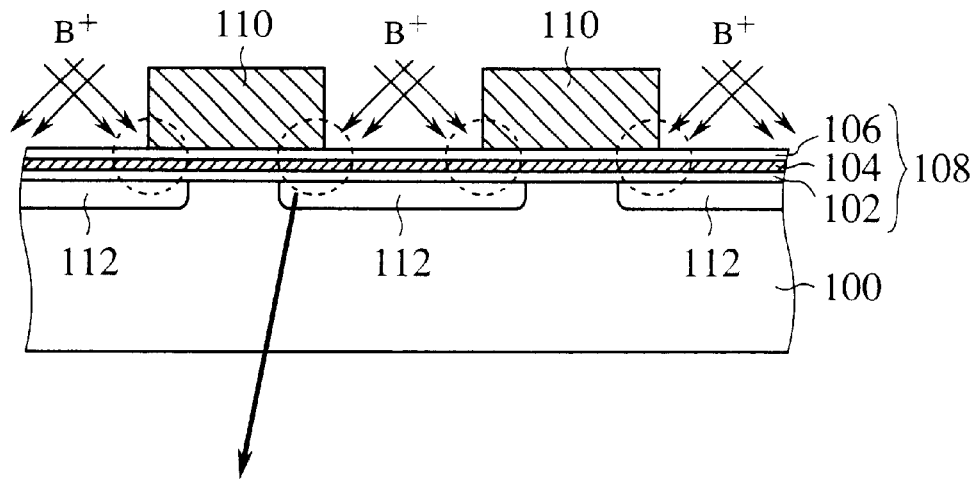
FIGS. 15A and 15B are views explaining a problem of the conventional method for fabricating the nonvolatile semiconductor memory device (Part 1).
Figure 15B:
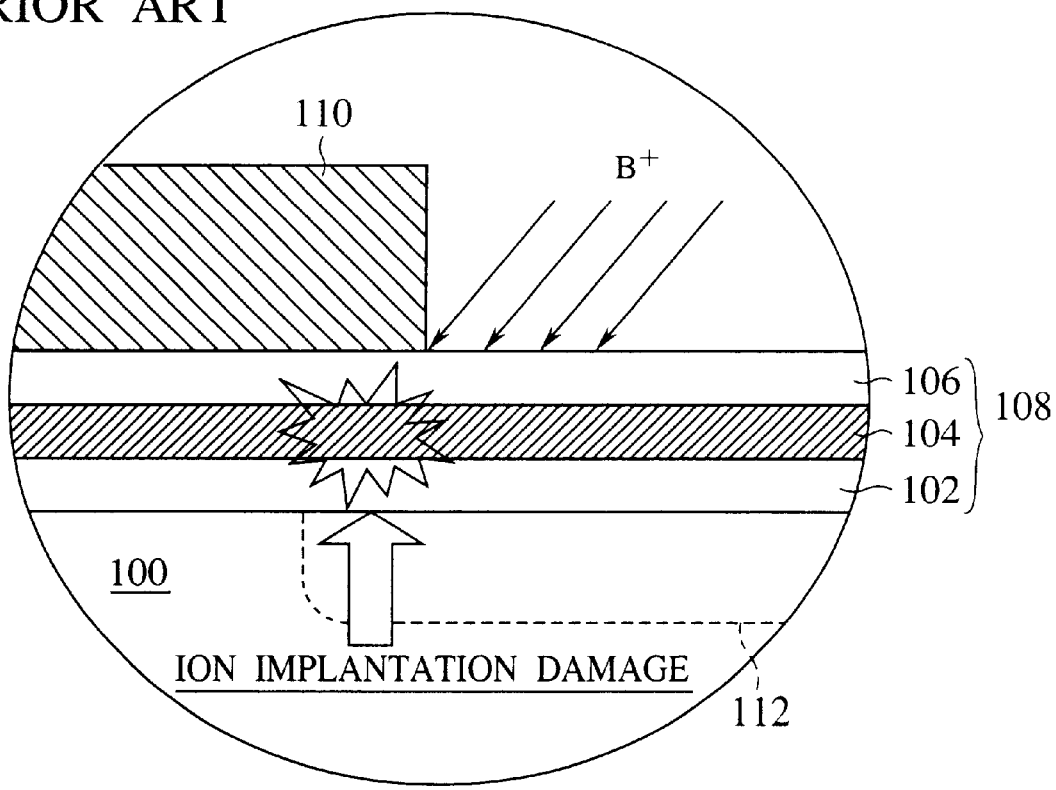
Figure 16A:
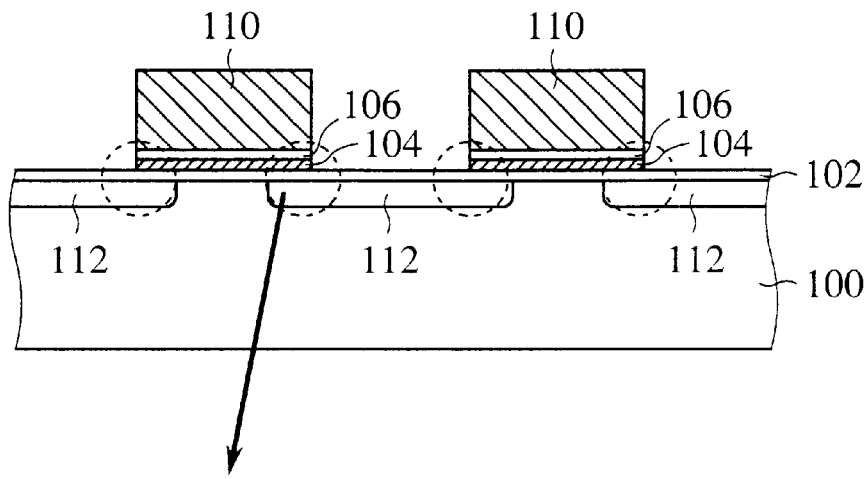
FIGS. 16A and 16B are views explaining a problem of the conventional method for fabricating the nonvolatile semiconductor memory device (Part 2).
Figure 16B:
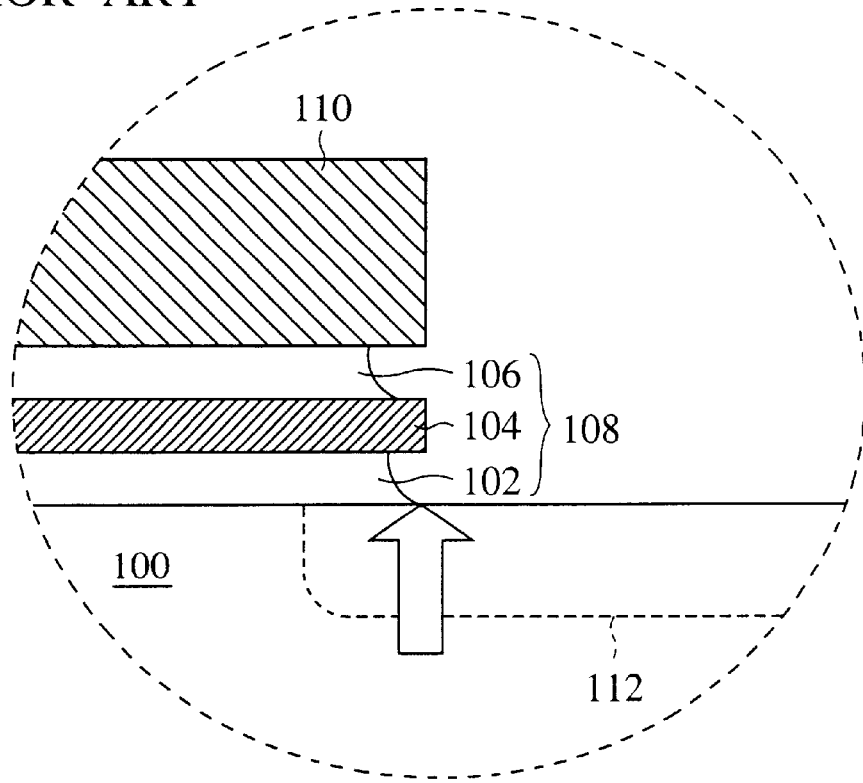

Then, the silicon substrate 10 is thermally oxidized with the silicon nitride film 52 as an oxidation mask to additionally oxidize the device isolation film 12 to form the device isolation film 12 of a prescribed film thickness and to form a bit line oxide film 32 (FIG. 11D).

Next, the sacrificial oxidation film is formed and removed, and the nonvolatile semiconductor memory device is fabricated in the same way as shown in FIG. 8C to FIG. 9C.

Thus, the nonvolatile semiconductor memory device according to the present embodiment can be fabricated without adding the step of forming the silicon nitride film 48.

In the above-described embodiments, the substrates are provided by silicon substrates but may be provided by SOI substrates in place of the silicon substrates. The nonvolatile semiconductor memory device using an SOI substrate can restrain parasitic capacitance increase and can have high operation speed. The use of SOI substrates is very effective in mounting also logic devices.

What is claimed is:

1. A method for fabricating a nonvolatile semiconductor memory device comprising the steps of:

forming an insulation film on a semiconductor substrate of a first conduction type;

introducing an impurity into the semiconductor substrate through the insulation film to form a source diffused layer and a drain diffused layer of a second conduction type which is different from the first conduction type, and a pocket layer of the first conduction type adjacent to the source diffused layer and the drain diffused layer;

removing the insulation film;

forming an insulative charge storage layer on the semiconductor substrate; and forming a gate electrode on the insulative charge storage layer between the source diffused layer and the drain diffused layer.

2. A method for fabricating a nonvolatile semiconductor memory device according to claim 1, in which the insulation film includes at least one silicon nitride film; and which further comprises, after the step of forming the source diffused layer, the drain diffused layer, and the pocket layer, the step of selectively oxidizing the semiconductor substrate with the silicon nitride film as a mask to form a bit line oxide film.

3. A method for fabricating a nonvolatile semiconductor memory device according to claim 2,
further comprising, before the step of forming the source diffused layer, the drain diffused layer, and the pocket layer, the step of selectively oxidizing the semiconductor substrate with the silicon nitride film as a mask to form a device isolation film.

4. A method for fabricating a nonvolatile semiconductor memory device according to claim 3,
in which the charge storage layer includes at least one silicon nitride film, and
which further comprises after the step of forming the charge storage layer, the step of selectively oxidizing the semiconductor substrate with the silicon nitride film as a mask to form a bit line oxide film.

5. A method for fabricating a nonvolatile semiconductor Memory device according to claim 4, wherein
the charge storage layer includes at least one silicon oxide film, and
the silicon oxide film is formed on the semiconductor substrate by thermal oxidation so as to have a large film thickness on the source diffused layer and the drain diffused layer than a film thickness on a rest region.

6. A method for fabricating a nonvolatile semiconductor memory device according to claim 2,
in which the charge storage layer includes at least one silicon nitride film, and
which further comprises after the step of forming the charge storage layer, the step of selectively oxidizing the semiconductor substrate with the silicon nitride film as a mask to form a bit line oxide film.

7. A method for fabricating a nonvolatile semiconductor memory device according to claim 6, wherein
the charge storage layer includes at least one silicon oxide film, and
the silicon oxide film is formed on the semiconductor substrate by thermal oxidation so as to have a large film thickness on the source diffused layer and the drain diffused layer than a film thickness on a rest region.

8. A method for fabricating a nonvolatile semiconductor memory device according to claim 1,
which further comprises, before the step of forming the insulation film, the step of forming a device isolation film, and
in which the insulation film is a sacrificial oxidation film which is formed after forming the device isolation film and is removed before forming the charge storage layer.

9. A method for fabricating a nonvolatile semiconductor memory device according to claim 8,
in which the charge storage layer includes at least one silicon nitride film, and
which further comprises after the step of forming the charge storage layer, the step of selectively oxidizing the semiconductor substrate with the silicon nitride film as a mask to form a bit line oxide film.

10. A method for fabricating a nonvolatile semiconductor memory device according to claim 9, wherein
the charge storage layer includes at least one silicon oxide film, and
the silicon oxide film is formed on the semiconductor substrate by thermal oxidation so as to have a large film thickness on the source diffused layer and the drain diffused layer than a film thickness on a rest region.

11. A method for fabricating a nonvolatile semiconductor memory device according to claim 8, wherein
the charge storage layer includes at least one silicon oxide film, and
the silicon oxide film is formed on the semiconductor substrate by thermal oxidation so as to have a large film thickness on the source diffused layer and the drain diffused layer than a film thickness on a rest region.

12. A method for fabricating a nonvolatile semiconductor memory device according to claim 1,
in which the charge storage layer includes at least one silicon nitride film, and
which further comprises after the step of forming the charge storage layer, the step of selectively oxidizing the semiconductor substrate with the silicon nitride film as a mask to form a bit line oxide film.

13. A method for fabricating a nonvolatile semiconductor memory device according to claim 12, wherein
the charge storage layer includes at least one silicon oxide film, and
the silicon oxide film is formed on the semiconductor substrate by thermal oxidation so as to have a large film thickness on the source diffused layer and the drain diffused layer than a film thickness on a rest region.

14. A method for fabricating a nonvolatile semiconductor memory device according to claim 1, wherein
the charge storage layer includes at least one silicon oxide film, and
the silicon oxide film is formed on the semiconductor substrate by thermal oxidation so as to have a large film thickness on the source diffused layer and the drain diffused layer than a film thickness on a rest region.

15. A method for fabricating a nonvolatile semiconductor memory device comprising the steps of:
forming an insulation film on a semiconductor substrate of a first conduction type;
introducing an impurity into the semiconductor substrate through the insulation film to form a source diffused layer and a drain diffused layer of a second conduction type which is different from the first conduction type, and a pocket layer of the first conduction type adjacent to the source diffused layer and the drain diffused layer;
removing the insulation film;
forming a charge storage layer on the semiconductor substrate; and
forming a gate electrode on the charge storage layer between the source diffused layer and the drain diffused layer.

* * * * *